(12) United States Patent
Tanaka et al.

(10) Patent No.: US 7,035,302 B2
(45) Date of Patent: Apr. 25, 2006

(54) OPTICAL TRANSMISSION MODULE

(75) Inventors: Tomokazu Tanaka, Yokohama (JP); Cleitus Antony, Yokohama (JP); Hiroo Matsue, Yokohama (JP); Hideki Murakawa, Yokohama (JP); Tadashi Hatano, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 146 days.

(21) Appl. No.: 10/384,509

(22) Filed: Mar. 6, 2003

(65) Prior Publication Data

US 2004/0114650 A1    Jun. 17, 2004

(30) Foreign Application Priority Data

Dec. 13, 2002   (JP) ............................. 2002-362377

(51) Int. Cl.
*H01S 3/00*  (2006.01)
(52) U.S. Cl. ............... 372/38.02; 372/38.1; 372/38.07
(58) Field of Classification Search ............ 372/38.02, 372/38.1, 38.07
See application file for complete search history.

(56) References Cited

U.S. PATENT DOCUMENTS

| | | | | |
|---|---|---|---|---|
| 4,284,872 A * | 8/1981 | Graeme | ................... | 219/121.69 |
| 4,356,379 A * | 10/1982 | Graeme | ....................... | 219/209 |
| 5,548,435 A * | 8/1996 | Tahara et al. | ................ | 398/195 |
| 5,631,916 A * | 5/1997 | Georges et al. | ................ | 372/28 |
| 5,877,851 A * | 3/1999 | Stann et al. | ................ | 356/5.09 |
| 5,883,910 A * | 3/1999 | Link | ....................... | 372/38.07 |
| 5,946,333 A * | 8/1999 | Kappeler | ................ | 372/29.022 |
| 6,087,899 A * | 7/2000 | Kubota | ........................ | 330/253 |
| 6,606,177 B1 * | 8/2003 | Chujo et al. | ................. | 398/183 |
| 6,667,661 B1 * | 12/2003 | Liu et al. | .................... | 330/311 |
| 6,778,571 B1 * | 8/2004 | Vaughan | ..................... | 372/38.1 |
| 6,829,441 B1 * | 12/2004 | Chujo et al. | ................. | 398/183 |
| 6,859,624 B1 * | 2/2005 | Kuo et al. | ................... | 398/182 |
| 2003/0002551 A1 * | 1/2003 | Kwon et al. | ............. | 372/38.02 |

FOREIGN PATENT DOCUMENTS

| | | |
|---|---|---|
| JP | 05-218543 | 8/1993 |
| JP | 07-334859 | 12/1995 |
| JP | 2001-015854 | 1/2001 |
| JP | 2001-111167 | 4/2001 |
| JP | 2002-277840 | 9/2002 |

OTHER PUBLICATIONS

"Euvis LD132DZ" product datasheet for laser diode driver, document No. LD132DZ_DS_1D2, Euvis, Inc. 31194 La Baya Dr. Suite 107, Westlake Village, CA 91362,USA, pp 1-7 (2003).
"Evaluation Board Application Note for 10Gb/s Differential Laser Diode Driver LD132DZ," product information, Euvis, Inc. 31194 La Baya Dr. Suite 107, Westlake Village, CA 91362,USA, pp1-5 (2003).

* cited by examiner

*Primary Examiner*—Minsun Harvey
*Assistant Examiner*—Phillip Nguyen
(74) *Attorney, Agent, or Firm*—Townsend and Townsend and Crew LLP

(57) ABSTRACT

The present invention provides an optical transmission module having a laser diode that generates laser beams and a differential type current switch provided with a first switch and a second switch in order to supply a modulating current to the laser diode. A terminal of the laser diode and the first switch are connected in series through a first transmission line and a first capacitor, the other terminal of the laser diode and the second switch are connected in series through a second transmission line and a second capacitor. The current driven by the second switch is terminated by a resistor connected to the first switch and the current driven by the first switch is terminated by a resistor connected to the second switch. Thus, the laser diode is modulated bidirectionally.

7 Claims, 3 Drawing Sheets

OPTICAL TRANSMISSION MODULE

BACKGROUND OF THE INVENTION

The present invention relates to an optical transmission module, and it relates in particular to a circuit system of a driving circuit for a laser diode in a transmitting circuit for an optical communication system.

The optical transmission module which has been known to the public is composed of a differential amplifier for waveform shaping of an input signal, a differential type current switch which generates a modulating current for driving a laser diode upon receipt of the output signal of the differential amplifier, a variable current supply which varies the current to be supplied to the differential type current switch and a bias current supply for supplying a DC bias current to the laser diode. Some of the above-mentioned variable current supplies can be adjustable in accordance with the setting of an optical output or luminous efficiency characteristics of a laser diode (refer to Japanese Patent Laid-open No. 5-218543).

A prior art optical transmission module is shown in FIG. 5.

FIG. 5 is a circuit diagram of the prior art optical transmission module. In the case of the optical transmission module shown in FIG. 5, a laser diode 200 is disposed in the right vicinity of a laser driving circuit 208. A differential type current switch 206 is composed of transistors TR1 and TR2 and it is driven by a differential signal voltage input through input terminals 204 and 205 of the differential type current switch 206. The current supplied by the modulating current supply 207 is divided and supplied to a resistor 203 and a laser diode 200 by the differential type current switch 206, and the laser diode 200 is modulation-driven according to an input signal.

Further, a bias current supply 202 supplies a bias current to the laser diode 200. For the purpose of preventing the leakage of a signal current, a bias tee 201 is inserted between the bias current supply 202 and the laser diode 200.

If high-speed modulation of the laser diode 200 is carried out by use of the present circuit system, it is absolutely necessary to dispose the laser diode 200 at a position sufficiently nearer to the laser driving circuit 208 in order to prevent the deterioration of the waveform of the signal current caused by the reflection thereof. It is also necessary to use the wiring of enough low inductance to prevent the voltage drop caused by the inductance of the wiring. The phenomena mentioned in the above, mean that the higher becomes the signal speed the more difficult becomes the technique of mounting of parts. When the present circuit is used for an optical transmission module for which high speed modulation is always required, a highly precise mounting technique is needed, which naturally raises the manufacturing cost of an optical transmission module.

Further heat generating components are mounted close up together, so that it is difficult to effectively dissipate the heat generated by the laser driving circuit 208 and the laser diode 200.

Next, an optical transmission module which can be mounted simpler than the above module will be explained referring to FIG. 6.

FIG. 6 shows a circuit diagram of another example of a conventional optical transmission module. In the case of the present optical transmission module, an impedance controlled high frequency transmission line is used for the wiring between a laser driving circuit 312 and a laser diode 300. A termination resistor 303 is inserted between the laser diode 300 and the transmission line 304 to prevent the reflection of a signal current at the end of the transmission line 304.

A bias current is supplied to the laser diode 300 through a low pass filter 301 from the bias current supply 302. A capacitor 305 is inserted in the transmission line 304 to prevent the voltage drop caused by the bias current which may influence on the operation of the differential type current switch 308.

In order to secure the bias voltage of the differential type current switch 308, a resistor 306 is inserted between the power supply and the transistor TR2 in the differential type current switch 308. Further, a resistor 307 is inserted between the power supply and the transistor TR1 to prevent the deterioration of the current waveform to be supplied to the laser diode 300.

Owing to the adoption of the present configuration, it is made possible to dispose the laser diode 300 and the laser diode driving circuit 312 apart from each other and also it is made possible to drive the laser diode at a high speed with a simple mounting technique and cheep mounting cost. That is, in the present configuration, there is no need to dispose the laser driving circuit 312 and the laser diode 300 at near by places from each other, and since it is possible to pack only the laser diode 300 into a package and make it a transmitting subassembly, so that it is made possible to actually mount necessary components at a cheep price and with an easy technique.

On the other hand, when the present circuit is adopted, a resistor 303 is inserted in series with the laser diode 300 to terminate the transmission line 304. The value of the resistor is in the range of 25 to 50 ohms caused by a limitation on the design of a transmission line, and it is a large resistance in comparison with that of the laser diode. When the laser diode is driven, the voltage drop at the output terminal of the differential type current switch 308 caused by the resistor becomes large. Since a certain bias voltage is needed to make the differential type current switch 308 and the current supply 311 operate normally. Therefore, in order to obtain an output having a good waveform, the laser diode has to be driven in such a manner that the voltage at the output terminal of the transistor TR2 of the differential type current switch 308 is always kept not less than a certain level. Consequently, when the laser diode is driven according to the present system, in order to compensate the voltage drop, a higher power supply voltage is needed in comparison with that of the system shown in FIG. 5.

Further, since the resistor 303 consumes about half of the current supplied by the differential type current switch 308, the modulation current supply 311 has to supply twice the current to be utilized by the laser diode 300. Therefore, the current consumed by the laser driving circuit 312 has to be doubled comparing to that of the system shown in FIG. 5.

The prior art related to bidirectional drive of laser diodes, etc. using differential signals are known from the following patent documents: Japanese Patent Laid-open Nos. 07-334859, 2001-015854, 2001-111167 and 2002-277840.

As mentioned in the above, when high-speed laser modulation is to be performed in the prior art shown in FIG. 5, the apparatus becomes complicated and high cost, and further since heat generating components are aggregated, it becomes difficult to dissipate the generated heat effectively.

In the case of the prior art shown in FIG. 6, the mounting of components can be done without a difficult technique; accordingly the manufacturing cost can be low. However, the voltage drop is increased caused by the resistor, which requires a higher power supply voltage in comparison with that of the system shown in FIG. 5. It means larger power consumption in the system.

SUMMARY OF THE INVENTION

In recent years, with the miniaturization of optical transmission apparatuses, a laser diode driving circuit being cheep in cost, operable at a low voltage and of low power consumption has keenly been demanded.

It is therefore an object of the present invention is to solve the defects of the prior art driving circuit and to provide a high-speed laser driving technique, which offers simpler mounting, a lower power supply voltage, and lower power consumption in comparison with those of the prior art.

In order to achieve the object, an optical transmission module according to the present invention comprises a laser diode that generates laser beams and a differential type current switch having a first switch and a second switch for the purpose of supplying modulating currents to the laser diode, wherein a terminal of the laser diode and the first switch are connected through a transmission line and a capacitor, and another terminal of the laser diode and the second switch are connected through a transmission line and a capacitor, and resistors are connected between respective output terminals of the differential type current switch and the power supply unit to terminate transmission lines. Thus the laser diode is modulated with the arrangement mentioned in the above.

DETAILED DESCRIPTION OF THE PREFERRED EMBODIMENTS

The preferred embodiments according to the present invention will be described below with reference to the drawings.

Figure 1:
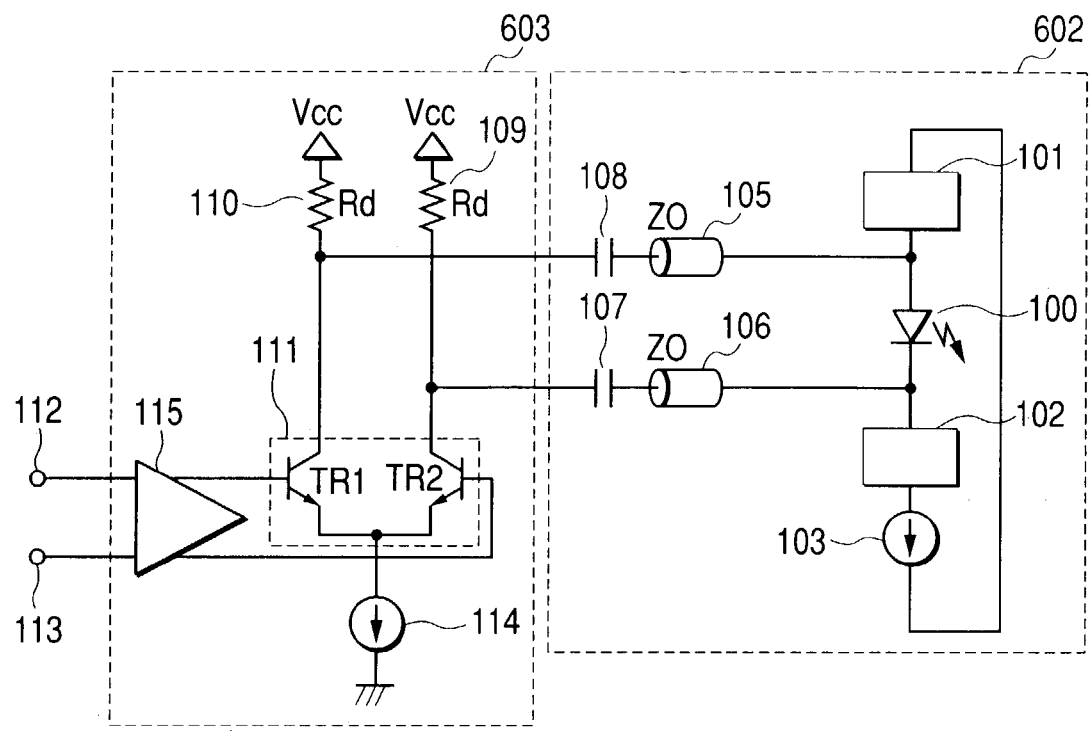
FIG. 1 is a schematic circuit diagram of an embodiment of an optical transmission module according to the present invention.

FIG. 1 is a schematic circuit diagram showing an embodiment of the optical transmission module according to the present invention.

Figure 2:
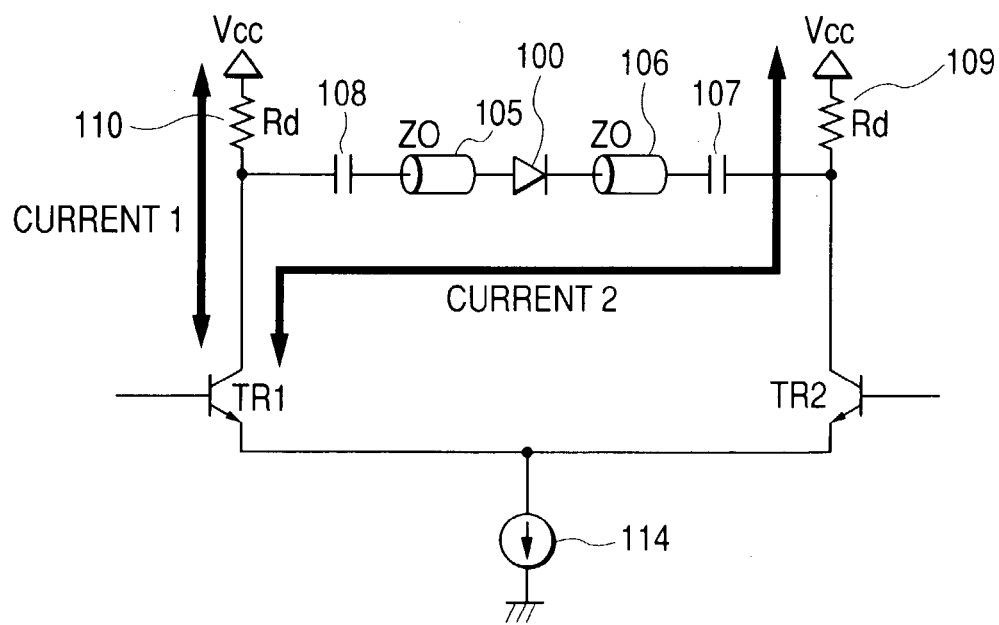
FIG. 2 is a circuit diagram showing the path of a driving current of a transistor TR1 in the laser driving circuit shown in FIG. 1.

At first, a circuit operation will be explained in the case where an AC equivalent resistance of a laser diode 100 is low enough in comparison with the characteristic impedance of transmission lines 105, 106, the circuit operation will be explained. The transmission lines 105, 106 are the lines whose characteristic impedance is designed to be constant for high frequency (not less than 1 GHz) currents. In the figure, a differential amplifier circuit 115 receives input signals from input terminals 112, 113 to shape the waveform thereof into differential voltage input signals. Upon receipt of the differential voltage input signals, a differential type current switch 111 is driven thereby. Thus, the current supplied by the modulation current supply 114 is switched to the transmission line 106 or the transmission line 105. In other words, the currents which pass through a transistor TR1 in the differential type current switch 111 as shown in FIG. 2, are composed of a current 1 which flows through a resistor (Rd) 110, the transistor TR1 and a modulating current supply 114 and a current 2 which flows through a resistor (Rd) 109, a capacitor 107, a transmission line (Z0) 106, a laser diode 100, a transmission line (Z0) 105, a capacitor 108, the transistor TR1 and the modulation current supply 114. In this case, the current 2 which flows through the transmission line 106 is terminated with a resistor 109, which prevents the reflected signal current from flowing into the laser diode 100. Likewise, the currents which flow through a transistor TR2 are composed of two kinds of currents: one flows through the resistor (Rd) 109, the transistor TR2 and the modulation current supply 114; the other flows through the resistor (Rd) 110, the capacitor 108, the transmission line (Z0) 105, the laser diode 100, the transmission line (Z0) 106, the capacitor 107, the transistor TR2, and the modulation current supply 114. In this case, the latter current that flows through the transmission line 105 is terminated with the resistor 110, which prevents the reflected signal current from flowing into the laser diode 100.

As mentioned above, the transmission lines 105, 106 transmit signal currents driven by the differential type current switch 111 to the laser diode 100 and they are terminated with the resistors 109 and 110.

Next, an circuit operation will be explained in the case where AC equivalent resistance of the laser diode 100 is unable to regard low enough in comparison with the characteristic impedance of the transmission lines 105, 106. In this case, part of the current driven by the transistor TR1 reflects between the laser diode 100 and the transmission line 105, and part of the current driven by the transistor TR2 reflects between the laser diode 100 and the transmission line 106. However, the reflection occurs uniformly ranging the whole frequency band, and even though the amplitude of the signal is decreased, the reflection does not exert its influence on the waveforms of signals. Therefore it is possible to drive the laser diode with a current having a good waveform, so that even in the case where the value of the AC equivalent resistance of the laser diode is unable to regard low enough in comparison with the characteristic impedance of the transmission lines 105, 106, no problem occurs.

Even in the case where the laser diode 100 has an comparatively large inductive or a capacitive component and it is unable to regard the laser diode as a pure resistor, it is possible to regard the laser diode as an approximate pure resistor and to prevent the waveform from deterioration by the insertion of a low valued resistor in series with the laser diode 100.

In the present embodiment, in order to supply a bias current to the laser diode without exerting bad influence on the signal currents on both the transmission lines 105, 106, bias-tees 1011 102 are provided on both sides of the laser diode 100 and through the bias-tees the laser diode is connected to the current supply 103. These bias-tees 101, 102 are the circuits to superimpose or to extract a bias DC component without giving any influence upon the high frequency signal being transmitted by the transmission lines 105, 106. In order to prevent the deficiency in the driving voltage for the differential type current switch 111 due to the voltage drop caused by the bias current, capacitors 107 and 108 are inserted in the transmission lines 106 and 105, respectively.

In the present embodiment, since it is possible to connect the laser diode 100 to the differential type current switch 111 in the laser driving circuit 603 with impedance matched transmission lines 105, 106, the laser diode 100 and the laser driving circuit 603 can be mounted at their respective positions remote from each other. Thus, a precise mounting technique is not needed and simple mounting is made possible.

Further, in the present embodiment, the laser diode 100 is modulated bidirectionally, the current from the modulating current supply 114 can effectively be supplied to the laser diode 100. The relation between the modulating current amplitude Imod of the laser diode 100 and the current quantity Imodsource of the modulating current supply 114 is shown in (Equation 1). R1d denotes the AC equivalent resistance of the laser diode 100. Rd denotes the resistance of the resistors 109, 110.

$$Imodsource = \{(2Rd+Rld)/2Rd\} \times Imod \qquad \text{(Equation 1)}$$

Figure 5:
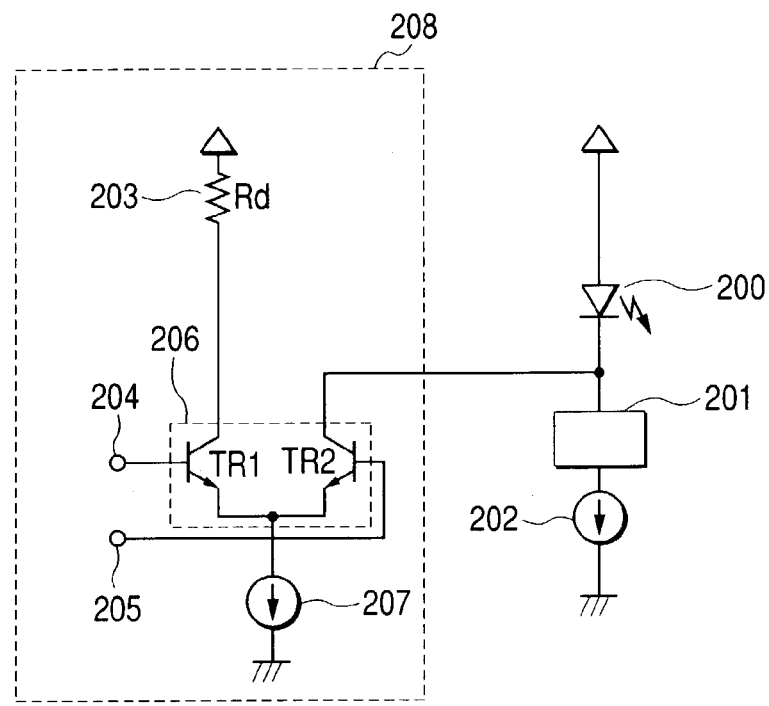
FIG. 5 is a circuit diagram of a prior art optical transmission module.

Assuming that Rd=50Ω, R1d=10Ω, Imod=30 mA, by way of example, Equation 1 leads to Imodsource=33 mA. In the case of the prior art shown in FIG. 5, Imodsource=60 mA can be obtained under the same conditions. This shows that a large amount of economy in power consumption can be expected.

Figure 6:
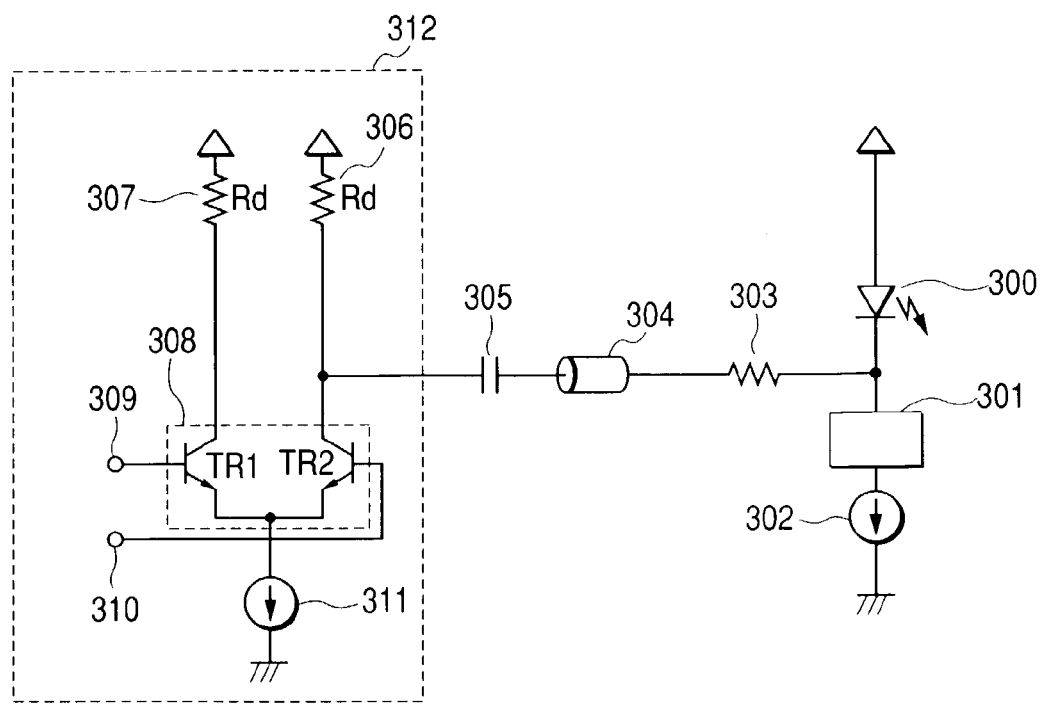
FIG. 6 is a circuit diagram of another prior art optical transmission module.

Further, according to the present embodiment, as shown in FIG. 6, the termination resistor 303 is not inserted in series with the laser diode 300, so that the voltage drop at the output terminal of the differential type current switch 111 is decreased, so that the laser diode 100 can be driven by a lower power supply voltage Vcc. As mentioned above, to make the differential type current switch 111 and the modulating current supply 114 operate normally, a certain bias voltage is needed. When it is assumed that the voltage difference between the bias voltage and the power supply voltage Vcc is Vheadroom, the relation between the Vheadroom and the Imod can be expressed by (Equation 2).

$$Vheadroom = \{(4Rd+Rld)/4\} \times Imod \qquad \text{(Equation 2)}$$

When it is assumed that Rd=50Ω, R1d=10Ω, Imod=30 mA, by way of example, the voltage necessary for drive, Vheadroom=1.575 V can be obtained. In the case of the prior art shown in FIG. 5, Vheadroom requires 2.25 V under the same conditions. This shows that the present embodiment can remarkably lower the required power supply voltage.

Further, the differential type current switch 111 in the laser driving circuit 603 is connected to the laser diode 100 through the differential transmission lines of low radiation efficiency, so that the currents in the opposite phase to each other flow between the differential type current switch 111 in the laser driving circuit 603 and the laser diode 100, so that electromagnetic radiations are also in opposite phase and they are cancelled each other. Therefore, it is made possible to control the electromagnetic radiation low and decrease EMI (Electromagnetic Interference).

Figure 3:
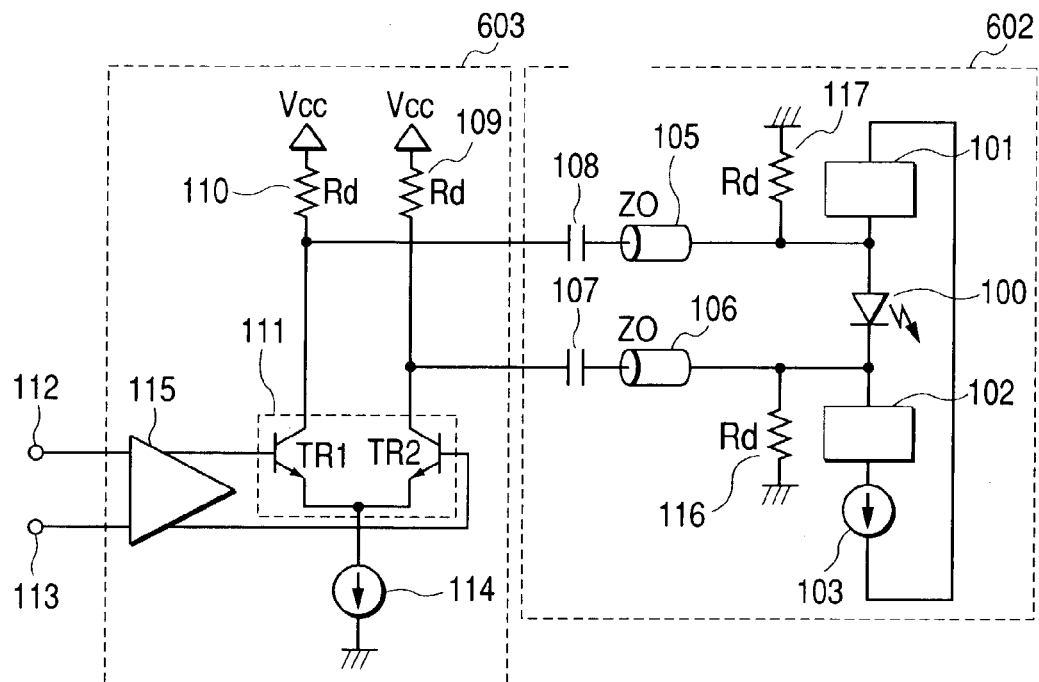
FIG. 3 is a circuit diagram of another embodiment of the optical transmission module according to the present invention.

FIG. 3 shows the circuit diagram of another embodiment of an optical transmission module according to the present invention. The present embodiment comprises resistors 116, 117 in addition to the configuration of the embodiment shown in FIG. 1. The resistors 116, 117 constitute an impedance matching circuit that suppresses the reflection of signals at the ends of the laser diode.

The present embodiment is configured such that the resistors 116, 117 constituting the impedance matching circuits are connected in parallel with both the terminals of the laser diode 100, respectively. The resistance Rs of each of the resistors 116, 117 is determined by (Equation 3).

$$Rs = \{Rd^2 + Rd\sqrt{(Rd^2+Rld^2)}\} \times Rld \qquad \text{(Equation 3)}$$

In the present system, it is possible to obtain the same effect as that obtained in the previous embodiment.

Figure 4:
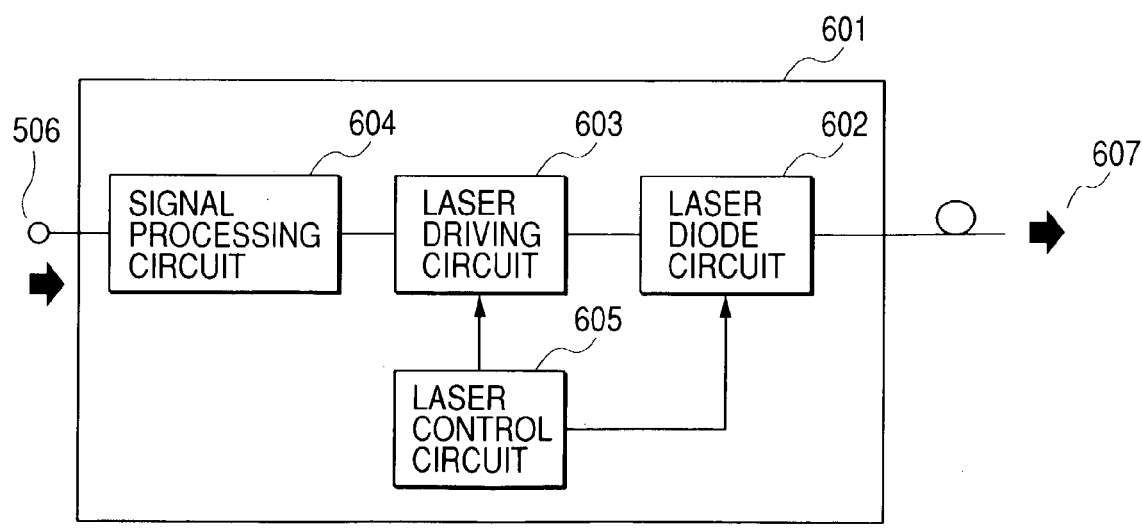
FIG. 4 is a schematic block diagram showing the whole of the optical transmission module according to the present invention.

Next, the whole configuration of the optical transmission module according to the present invention will be explained referring to FIG. 4. The whole of the optical transmission module 601 comprises the following components: a laser diode circuit 602 including the laser diode 100 which outputs optical signals 607; a laser driving circuit 603 which drives the laser diode 100 constituted as shown in FIG. 1 or FIG. 3; a signal processing circuit 604 which converts input digital signals 606 to coded signals and which inputs differential voltage signals to the input terminals 112, 113; and a laser control circuit 605 for controlling the modulating current supply 114 in the laser driving circuit 603, a current supply 103 for the laser diode circuit 602. The laser diode circuit 602 shall comprise the transmission lines 105, 106, capacitors 108, 107, bias-tees 101, 102, the current supply 103, the laser diode 100, etc.

As mentioned in the above, the present invention makes it possible to provide an optical transmission module of low voltage, of low power consumption and of low EMI with a simple mounting technique.

The invention claimed is:

1. An optical transmission module comprising:
   a laser diode which generates a laser beam; and
   a differential type current switch having a first switch and a second switch for the purpose of supplying a modulating current to said laser diode, each of the first switch and second switch being a bipolar transistor, a collector terminal of said first switch being connected to a DC power supply voltage through a first resistor, a collector terminal of said second switch being connected to a DC power supply voltage through a second resistor, an emitter terminal of said first switch and an emitter terminal of said second switch being connected together and being connected to ground potential via a single common modulation current supply;
   wherein an anode of said laser diode is connected to a collector terminal of said first switch and a cathode of said laser diode is connected to a collector terminal of said second switch, thereby modulating said laser diode bidirectionally using the anode and the cathode.

2. An optical transmission module according to claim 1, wherein bias-tees are respectively connected to both the terminals of said laser diode, and a bias voltage is applied to said laser diode through said bias-tees.

3. An optical transmission module according to claim 1, wherein a first transmission line is connected between the anode of said laser diode and said first switch, and a second transmission line is connected between the cathode of said laser diode and said second switch.

4. An optical transmission module according to claim 3, wherein a first capacitor connected in series to said first transmission line and a second capacitor is connected in series to said second transmission line.

5. An optical transmission module according to claim 3 wherein a first impedance matching circuit is provided between the anode of said laser diode and said first transmission line, a second impedance matching circuit is provided between the cathode of said laser diode and said second transmission line, and impedance matching is established between said first and second transmission lines and said laser diode.

6. An optical transmission module according to claim 5 wherein said first impedance matching circuit includes a first resistor and said second impedance matching circuit includes a second resister.

7. An optical transmission module according to claim 3, wherein a current driven by said second switch is terminated with a resistor connected to said first switch, and a current driven by said first switch is terminated with a resistor connected to said second switch.

* * * * *